(12) United States Patent
Tauber et al.

(10) Patent No.: US 7,336,981 B1
(45) Date of Patent: Feb. 26, 2008

(54) RARE EARTH METAL COMPOUNDS FOR USE IN HIGH CRITICAL TEMPERATURE JOSEPHSON JUNCTIONS

(75) Inventors: Arthur Tauber, Elberon, NJ (US); Robert D. Finnegan, West Long Branch, NJ (US); William D. Wilber, Neptune, NJ (US); Steven C. Tidrow, Silver Springs, MD (US); Donald W. Eckart, Wall, NJ (US); William C. Drach, West Long Branch, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 891 days.

(21) Appl. No.: 10/783,293

(22) Filed: Feb. 18, 2004

Related U.S. Application Data

(60) Division of application No. 09/845,108, filed on Apr. 26, 2001, now Pat. No. 6,827,915, which is a continuation-in-part of application No. 09/337,724, filed on Jun. 21, 1999, now abandoned, which is a continuation-in-part of application No. 08/717,822, filed on Sep. 24, 1996, now abandoned, which is a continuation-in-part of application No. 08/333,669, filed on Nov. 3, 1994, now abandoned.

(51) Int. Cl.
*H01B 12/00* (2006.01)
(52) U.S. Cl. .................................... 505/190
(58) Field of Classification Search ............. 505/190
See application file for complete search history.

(56) References Cited

OTHER PUBLICATIONS

Blasse, New compounds with perovskite-like structures Koninkl. Ned. Akad. Wetenschap., Proc. Ser. B, 67(3), pp. 312-313.*
Wittmann, et al., "On the ordering of . . . Sb,Nb,Ta)" Z. Anorg. Allg. Chem., 482, pp. 143-153.*
Fesenko, et al., "Synthesis and study of . . . perovskite structure" Izv. Akad. Nauk. SSSR, Neorg. Mater., 6(4), pp. 800-802.*

* cited by examiner

*Primary Examiner*—Steven Bos
(74) *Attorney, Agent, or Firm*—Michael Zelenka; George B. Tereschuk

(57) ABSTRACT

Rare earth metal containing compounds of the formula $Sr_2YbSbO_6$ have been prepared with high critical temperature thin film superconductor structures, and can be fabricated into a superconductor insulator superconductor step edge Josephson junction, as well as being used in other ferroelectrics, pyroelectrics, and hybrid device structures.

6 Claims, No Drawings

RARE EARTH METAL COMPOUNDS FOR USE IN HIGH CRITICAL TEMPERATURE JOSEPHSON JUNCTIONS

DIVISIONAL APPLICATION

This application is a divisional application of U.S. patent Ser. No. 09/845,108 filed on Apr. 26, 2001 now U.S. Pat. No. 6,827,915, entitled, "Rare Earth Metal Containing Compounds and High Critical Temperature Thin Film Superconductors, Ferroelectrics, Pyrolelectrics, Piezoelectrics and Hybrids," which was issued on Dec. 7, 2004, which was a continuation in part of U.S. patent application Ser. No. 09/337,724, filed on Jun. 21, 1999, and now abandoned, which was a continuation in part of U.S. patent application Ser. No. 08/717,822, filed on Sep. 24, 1996, and now abandoned. That application (Ser. No. 08/717,822) was a continuation in part of U.S. patent application Ser. No. 08/333,669 filed on Nov. 3, 1994, and now abandoned. This divisional application is being filed under 35 USC § 120, 35 USC § 121 and 37 CFR § 1.53 (b), and priority from the Nov. 3, 1994 effective date of the first application (08/333,669) is hereby claimed.

RELATED APPLICATION

U.S. patent application Ser. No. 08/502,739, entitled "Compounds in the Series $A_2MeSbO_6$ for Use as Substrates, Barrier-Dielectric Layers and Passivating Layers in High Critical Temperature Superconducting Devices," which has been assigned to the same assignee issued as U.S. Pat. No. 5,814,584 on Apr. 29, 1998 and is related to this application.

GOVERNMENT INTEREST

The invention described herein may be manufactured, used, and licensed by or for the Government for governmental purposes without the payment to use of any royalties thereon.

FIELD OF INVENTION

The invention relates in general to new and useful rare earth metal containing compounds, and in particular to new uses for compounds of the general formula $Sr_2RESbO_6$ where RE is a rare earth metal.

BACKGROUND OF THE INVENTION

Heretofore, the best substrate or barrier dielectric in thin film superconductor technology has been $LaAlO_3$. However, there have been problems with the use of $LaAlO_3$. For one, its dielectric constant is anisotropic and too high. This automatically prevents one from making certain types of devices. It also undergoes a phase transition leading to twinning and stress. The present invention provides a solution to many of the shortcomings and problems associated with the use of $LaAlO_3$.

SUMMARY OF THE INVENTION

The general object of this invention is to provide materials that can be used as a substrate or barrier dielectric in thin film superconductor technology that can overcome the problems, shortcomings and limitations of $LaAlO_3$. A more particular object of the invention is to provide a substrate or barrier dielectric with a low dielectric constant, a low dielectric loss, and a material that does not undergo a phase transition that leads to twinning and stress. It is a further object of the present invention to provide compounds and structures producing tetragonal phases that are extremely useful as dielectric substrates and buffer layers for YBCO and other thin film superconductor devices.

It has now been found that the aforementioned objects can be attained using a compound of the general formula $Sr_2RESbO_6$ where RE is a rare earth metal as the substrate or barrier dielectric in thin film superconductor technology. In the above formula, RE can be Lu, Yb, Tm, Er, Ho, Dy, Tb, La, Pr, Y Sm, Nd, Eu or Gd. These compounds can be used as barrier or buffer layers and substrates in thin film high critical temperature superconducting structures, as well as antennas and other devices such as ferroelectrics, pyroelectrics, piezoelectrics and hybrids.

DESCRIPTION OF THE INVENTION

Indexed powder diffractometer data taken using CuKα radiation, reveals these compounds to be ordered perovskites. With the exceptions of $Sr_2LuSbO_6$ and $Sr_2LaSbO_6$ that are cubic, all of the other compounds are found to be pseudo-cubic, tetragonal. Single and multilayer thin films are prepared by KrF pulsed laser ablation. By thin films is meant film thicknesses ranging from about 100 Å to about 10 μm. All $Sr_2RESbO_6$ films exhibit a primary (h00) and a secondary (2n, 2n, 0) orientation. Dielectric constants and losses are measured in bulk samples by a cavity perturbation technique at X band and on films by an impedance bridge at 1 MHz. The term "low dielectric loss," as used throughout this disclosure, is defined as any dielectric loss lower than $1 \times 10^{-2}$. The term "low dielectric constant," as used throughout this disclosure, is defined as any dielectric constant lower than 20, and, in this invention ranges from 5.1-16.3 in the bulk and from 4.1-16.3 in the thin film form, within an experimental error of +/−5%. Results are given in the TABLE I, below and while dielectric constants for thin films are generally similar to the bulk values, factors such as density differences between the bulk and thin film samples result in differences in dielectric constant in some cases.

The following compounds in the series $Sr_2RESbO_6$ have been synthesized for use as dielectric substrates or barrier layers or passivation layers in thin film high critical temperature superconductor devices:

TABLE 1

| Compound Formula | Lattice Parameter (Å) | | | Density GM/CC | Dielectric Constant | | Dielectric Loss Factor X $10^{-3}$ | | Color |
|---|---|---|---|---|---|---|---|---|---|
| | a | c | c/a | | BULK | FILM | BULK | FILM | |
| $Sr_2LaSbO_6$ | 8.325 | — | 1.0 | 5.91 | 16.3 | — | 3.8 | — | beige |
| $Sr_2PrSbO_6$ | 8.390 | 8.362 | .9966 | 6.02 | 10.9 | — | 2.2 | — | d.gray* |

TABLE 1-continued

| Compound | Lattice Parameter (Å) | | | Density | Dielectric Constant | | Dielectric Loss Factor X $10^{-3}$ | | Color |
|---|---|---|---|---|---|---|---|---|---|
| Formula | a | c | c/a | GM/CC | BULK | FILM | BULK | FILM | |
| $Sr_2NdSbO_6$ | 8.365 | 8.320 | .9946 | 6.13 | 10.6 | — | 2.9 | — | beige |
| $Sr_2SmSbO_6$ | 8.335 | 8.295 | .9952 | 6.26 | 13.6 | 8.8 | <1 | 9 | d.beige |
| $Sr_2EuSbO_6$ | 8.320 | 8.300 | .9975 | 6.30 | 14.6 | 4.6 | <1 | 2 | l.yellow* |
| $Sr_2GdSbO_6$ | 8.295 | 8.280 | .9978 | 6.42 | 12.1 | 6.0 | <1 | 9 | beige |
| $Sr_2TbSbO_6$ | 8.280 | 8.248 | .9961 | 6.48 | 12.9 | 4.6 | 1.4 | 4 | beige |
| $Sr_2HoSbO_6$ | 8.239 | 8.218 | .9975 | 6.64 | 11.6 | — | — | 3.1 | white |
| $Sr_2DySbO_6$ | 8.248 | 8.224 | .9971 | 6.64 | 11.2 | — | <1 | — | beige |
| $Sr_2ErSbO_6$ | 8.222 | 8.204 | .9974 | 6.77 | 5.3 | 4.1 | 1.6 | 3.2 | white |
| $Sr_2TmSbO_6$ | 8.204 | 8.185 | .9976 | 6.86 | 10.0 | — | 2.0 | — | white |
| $Sr_2YbSbO_6$ | 8.190 | 8.176 | .9985 | 5.87 | 5.1 | — | <1 | — | white |
| $Sr_2YSbO_6$ | 8.231 | 8.216 | .9982 | 6.56 | 7.1 | — | 1.4 | — | white |
| $Sr_2LuSbO_6$ | 8.188 | — | 1.0 | 6.90 | 15.1 | — | <1 | — | beige |

*"d" denotes dark and "l" denotes light

Note that all compounds exhibit dielectric constants far superior (lower) than $LaAlO_3$ (22) and some superior to MgO(10). Based on an experimental error of +/−5%, the following thin film dielectric loss values are expected: 14.5-16.1 for $Sr_2LaSbO_6$; 10.4-11.4 for $Sr_2PrSbO_6$; 10.1-11.1 for $Sr_2NdSbO_6$; 11.1-12.2 for $Sr_2HoSbO_6$; 10.6-11.8 for $Sr_2DySbO_6$; 9.5-10.5 for $Sr_2TmSbO_6$; 4.8-5.4 for $Sr_2YbSbO_6$; 6.7-7.5 for $Sr_2YSbO_6$; and 14.3-15.9 for $Sr_2LuSbO_6$. The thin film values for dielectric losses in the $Sr_2LaSbO_6$; $Sr_2PrSbO_6$; $Sr_2NdSbO_6$; $Sr_2HoSbO_6$; $Sr_2DySbO_6$; $Sr_2TmSbO_6$; $Sr_2YbSbO_6$; $Sr_2YSbO_6$; and $Sr_2LuSbO_6$ compounds would be expected to be equivalent to the TABLE I empirical bulk values reported above.

All compounds exhibit properties making their use advantageous as dielectric substrates, buffer layers, in antenna structures and a number of superconductor structures. Pulsed laser ablation targets of the compounds containing rare earths are prepared as follows:

Stoichiometric amounts of $SrCO_3$, the rare earth oxides and $Sb_2O_3$ are weighed out, mixed together in a mortar, pressed into a disc and calcined at 1000° C. for 15 hours, then cooled to room temperature. The disc is ground in a mill to a particle size=100 μm, repressed into a disc, calcined at 1100° C. for 15 hours and cooled to room temperature. The discs are ground to a powder, pressed into a disc and heated a second time to 1200-1300° C. for 10-15 hours and cooled to room temperature. The disc is reground to a particle size of 100 μm, pressed into a 1¼ inch disc, isostatically pressed at 60000 PSI, sintered at 1400-1600° C. for 20 hours and slow cooled to room temperature. In this connection, by bulk is meant dense sintered polycrystalline bodies from about 1 to 1.25 inch in diameter and about 0.125 inch to ¼ inch thick. X-ray diffractometer traces are run to confirm that each disc is single phase and the lattice parameters are calculated from the indexed pattern. These compounds are distorted from cubic. They are indexed on the basis of a tetragonal unit cell with two exceptions, $Sr_2LuSbO_6$ and $Sr_2LaSbO_6$ that are cubic. See TABLE I. All these compounds form an ordered perovskite structure in which alternate B site ions are occupied by Sb and a rare earth ion. This gives rise to weak reflections in the X-Ray diffraction powder pattern that requires doubling of the unit cell.

It is important to note the significant relationship between the higher temperatures of 1400° C. and 1600° C. for 20-50 hours and the densities attained with these materials. The papers "Dielectric constants of yttrium and rare-earth garnets, the polarizability of gallium oxide and the oxide additivity rule," by R. D. Shannon et al. and "Dielectric polarizabilities of ions in oxides and fluorides," by R. D. Shannon established that the dielectric constant of a well-behaved complex oxide can be predicted by knowing the polarizability of the atoms making up the structure and the volume of the structure. From these relationships it is straightforward to understand that the dielectric constant of a material is sensitive to the sample's density. For instance, the more porous the sample (i.e. less dense), the lower the dielectric constant will be (air has a dielectric constant of roughly 1.00 for a sample density approaching 0%). When comparing two samples of the same compound with equivalent densities, e.g. both 100% dense, the same dielectric constant would be expected. However, when comparing two material samples with different densities and the same lattice parameter, the dielectric constant measurements can be appreciably different, again dependent on the difference in sample density.

Further, the polarizability of $Sb^{5+}$, which is a constituent atom of the materials used to fabricate the compounds and devices of the present invention, has not been previously known. The materials of the present invention all include at least one $Sb^{5+}$ constituent atom with a polarizability of about 1.2 $Å^3$. Therefore, prior art references that do not account for significant factors such as polarizability and material density have not predicted the advantageous dielectric constants of the materials of the present invention.

Additionally, it should be noted that only two of the compounds in the series $Sr_2RESbO_6$ were cubic: $Sr_2LuSbO_6$ and $Sr_2LaSbO_6$, both being ordered with a 1:1 distribution of RE and Sb on B sites, with a perovskite ideally being $ABO_3$. The ordering leads to a doubling of the unit cell. We have discovered that in order to achieve an ordered cubic single phase material, sintering at 1600° C. for at least 20 hours in the case of $Sr_2LuSbO_6$ and 1400° C. for $Sr_2LaSbO_6$ for at least 20 hours were essential. It is also noted that the cubic ordered perovskites prepared in connection with the present invention are quite different from those found in the literature because the compounds disclosed herein were prepared at higher temperatures for a longer period of time. The other compounds disclosed herein are similarly ordered but are pseudo-cubic, or tetragonal perovskites, which, except for $Sr_2NdSbO_6$, required sintering at temperatures between 1450° C. and 1600° C. for a minimum for 10 hours to achieve the tetragonal phase.

$LaAlO_3$ and MgO are often used as substrates on which high critical temperature superconducting film such as $YBa_2Cu_3O_{7-8}$ (YBCO) films are grown for device applications. The lattice mismatch for heteroepitaxial growth of YBCO on $LaAlO_3$ is outstanding, about 1%. For MgO it is about 7%. The mismatch in lattice parameter for the $Sr_2RESbO_6$ compounds epitaxially grown on YBCO is given in TABLE II, below. While their mismatch does not compare favorably with $LaAlO_3$, several compounds compare favorably with MgO. In general, the combination of lattice match, low dielectric constant, low dielectric loss, and absence of lattice strain and twinning due to phase transformation make these compounds superior to either $LaAlO_3$ or MgO.

TABLE II

% MISFIT TO YBCO

| COMPOUND | a-LATTICE PARAMETER | % MISFIT TO | |
|---|---|---|---|
| | | a YBCO | b YBCO |
| $Sr_2LaSbO_6$ | 8.325 | 8.2 | 6.5 |
| $Sr_2PrSbO_6$ | 8.390 | 8.9 | 7.2 |
| $Sr_2NdSbO_6$ | 8.370 | 8.7 | 7.0 |
| $Sr_2SmSbO_6$ | 8.330 | 8.3 | 6.6 |
| $Sr_2EuSbO_6$ | 8.320 | 8.2 | 6.5 |
| $Sr_2GdSbO_6$ | 8.295 | 7.7 | 6.2 |
| $Sr_2TbSbO_6$ | 8.280 | 7.7 | 6.0 |
| $Sr_2DySbO_6$ | 8.248 | 7.3 | 5.7 |
| $Sr_2HoSbO_6$ | 8.329 | 7.2 | 5.6 |
| $Sr_2ErSbO_6$ | 8.222 | 7.1 | 5.3 |
| $Sr_2TmSbO_6$ | 8.204 | 6.9 | 5.2 |
| $Sr_2YbSbO_6$ | 8.190 | 6.7 | 5.0 |
| $Sr_2YSbO_6$ | 8.231 | 7.1 | 5.4 |
| $Sr_2LuSbO_6$ | 8.188 | 6.6 | 4.9 |

Experimental conditions used to obtain single and multi-layered structures by laser ablation are described below: Thin films of $Sr_2RESbO_6$ (where RE=Y, La, Pr, Nd, Sm, Eu, Gd, Tb, Dy, Ho, Er, Tm, Yb and Lu) are deposited using the pulsed laser deposition technique. The KrF excimer laser ($\lambda$=248 nm) parameters are a pulse repetition rate of 10 Hz and a laser fluence of 1-2 $J/cm^2$ at the target (unless noted otherwise in TABLE III). Chamber deposition conditions are listed in TABLE III.

TABLE III

| | | Substrate | | Oxygen Pressure | Block |
|---|---|---|---|---|---|
| Ar# | Material | MgO | YBCO/MgO | (mTorr) | Temp(° C.) |
| 564 | $Sr_2YSbO_6$ | X | | 170 | 800 |
| | $Sr_2LaSbO_6$ | | | | |
| | $Sr_2PrSbO_6$ | | | | |
| | $Sr_2NdSbO_6$ | | | | |
| 593a | $Sr_2SmSbO_6$ | | X | 170 | 750 |
| 615 | $Sr_2EuSbO_6$ | | X | 100 | 750 |
| 593d | $Sr_2GdSbO_6$ | | X | 170 | 800 |
| 614 | $Sr_2TbSbO_6$ | | X | 250 | 750 |
| 593c | | | X | 170 | 800 |
| 613 | $Sr_2DySbO_6$ | | X | 170 | 750 |
| 790 | $Sr_2HoSbO_6$ | X | X | 130 | 825 |
| 593c | $Sr_2ErSbO_6$ | | X | 170 | 800 |
| 684* | $Sr_2TmSbO_6$ | X | | 250 | 785 |
| 618 | | | X | 100 | 750 |
| 792 | $Sr_2YbSbO_6$ | X | X | 130 | 825 |
| 685* | | | X | 250 | 785 |
| 565 | | | X | 170 | 800 |
| 789 | $Sr_2LuSbO_6$ | X | X | 130 | 825 |

*20 Hz laser repetition rate.

X-Ray diffraction analysis of the single layer films, $Sr_2RESbO_6$/MgO reveals that (400) is the strongest reflection with (200) weaker. However, (220) is strong and (440) weak but both are subsidiary to (400) and (200). For $Sr_2RESbO_6$/YBCO/MgO (400) and (200) are the primary reflections. (220) and (440) are present but now they are much weaker. Specific results are given in TABLE IV, below.

TABLE IV

| STRUCTURE | OBSERVED X-RAY REFLECTIONS | | | SAMPLE NO. |
|---|---|---|---|---|
| | YBCO | MgO | ANTIMONATE | |
| $Sr_2YbSbO_6$/MgO | | 003 | 002 200 strong | AR# 612 |
| | | 005 | 220 strong | |
| | | 006 | 400 very very weak | |
| | | 007 | 404 very weak | |
| | | 008 | | |
| | | 009 | | |
| $Sr_2TmSbO_6$/YBCO/MgO | 003 | 002 | 200 weak | AR# 618 |
| | 005 | 400 | 220 very weak | |
| | 006 | | 400 very weak | |
| | 007 | | | |
| | 009 | | | |
| $Sr_2EuSbO_6$/YBCO/MgO | 003 | 200 | moderate | AR# 615 |
| | 005 | | 400 very very strong | |
| | 006 | | | |
| | 007 | | | |
| | 008 | | | |
| $Sr_2SmSbO_6$/YBCO/MgO | 003 | 200 | 200 very strong | AR# 593A |
| | 005 | | 220 moderate | |
| | 006 | | 400 very very strong | |
| | 007 | | | |
| | 008 | | | |
| $Sr_2YSbO_6$/Mgo | | 200 | 200 strong | |
| | | 400 | 220 strong | |
| | | | 400 very strong | |
| | | | 440 weak | |
| | | | 600/442 weak | |
| $Sr_2LuSbO_6$/YBCO/MgO | 003 | 200 | 200 strong | AR# 789 |
| | 005 | 400 | 220 weak | |
| | 006 | | 400 very very strong | |
| | 007 | | 440 very weak | |
| | 009 | | 442 moderate | |
| | 0, 0, 10 | | 800 very strong | |
| | 0, 0, 11 | | | |
| $Sr_2YSbO_6$/MgO | | 200 | 200 weak | AR# 792 |
| | | 220 | 220 strong | |
| | | | 400 strong | |
| | | | 440 weak | |
| | | | 444 weak | |
| $Sr_2HoSbO_6$/MgO | | 200 | 200 moderate | AR# 790 |
| | | 400 | 220 strong | |
| | | | 400 very strong | |
| | | | 440 moderate | |
| $Sr_2HoSbO_6$/YBCO/MgO | 003 | 200 | 200 strong | AR# 790 |
| | 005 | 400 | 220 moderate | |
| | 006 | | 400 very strong | |
| | 007 | | 440 weak | |
| | 008 | | | |
| | 009 | | | |
| | 0, 0, 10 | | | |
| $Sr_2TmSbO_6$/YBCO/MgO | 003 | 200 | 200 moderate | AR# 684 |
| | 005 | 400 | 220 weak | |
| | 006 | | 400 strong | |
| | 007 | | 440 weak | |
| | 008 | | | |
| $Sr_2ErSbO_6$/YBCO/MgO | 003 | 200 | 200 strong | AR# 593C |
| | 005 | 400 | 220 weak | |
| | 006 | | 400 very strong | |
| | 007 | | | |
| | 008 | | | |
| $Sr_2EuSbO_6$/YBCO/MgO | 003 | 200 | 200 moderate | AR# 615 |
| | 005 | 400 | 220 weak | |
| | 006 | | 400 very strong | |
| | 007 | | | |
| | 008 | | | |
| | 009 | | | |
| | 0, 0, 10 | | | |
| $Sr_2TbSbO_6$/YBCO/MgO | 003 | 200 | 200 moderate | AR# 614 |
| | 005 | 400 | 220 weak | |
| | 006 | | 400 strong | |
| | 007 | | 800 weak | |

TABLE IV-continued

| STRUCTURE | OBSERVED X-RAY REFLECTIONS | | | SAMPLE NO. |
| --- | --- | --- | --- | --- |
| | YBCO | MgO | ANTIMONATE | |
| Sr$_2$SmSbO$_6$/YBCO/MgO | 009<br>0, 0, 10<br>0, 0, 11<br>003<br>005<br>006<br>007 | 200<br>400 | 200 strong<br>220 moderate<br>400 very strong | AR# 593A |

The quality of Sr$_2$RESbO$_6$ thin films on MgO and YBCO/MgO are very high judging from the surface reflectivity and the very large intensity of the (400) reflections. The latter implies an excellent approach to epitaxial growth especially with respect to YBCO.

Microwave measurements of real and imaginary parts of the dielectric constant of bulk Sr$_2$RESbO$_6$ are performed at approximately 9.32 and 10.1 GHz and room temperature. A cavity perturbation technique is used with a reflection-type, rectangular cavity excited in either the TE 106 mode (for 9.3 GHZ) or the TE107 mode (for 10.1 GHZ). The cavity is coupled to the waveguide by an adjustable iris having a 0.5 mm side by 35 mm long slot (cut along the center of one of the broad sides) providing access for the thin, rectangular samples cut from bulk Sr$_2$RESbO$_6$ polycrystalline discs. The samples are held such that their long dimension is parallel to the E-field of the cavity and they are positioned at the E-field maximum as determined by maximizing the shift of the cavity.

The real part of the dielectric constant is calculated from the shift in resonance frequency of the cavity due to the sample, and the imaginary component is calculated from a change in cavity Q. The accuracy of these measurements depends upon two general sources of error: 1) The accuracy of the cavity characterization; and 2) the material properties such as density and uniformity of shape. The error due to the cavity characterization results in an accuracy of approximately ±2% for the real part of the dielectric constant, and limits the resolution of the loss tangent (the imaginary component divided by the real component of the dielectric constant) to approximately 0.001. The error due to material properties and sample shape can be considerably greater than the cavity characterization error, particularly the error due to low material density, hence the densities of bulk materials are reported in the Density GM/CC column of TABLE I.

For thin films, the dielectric constant and loss are obtained by an impedance measurement at 1 MHz. These films are prepared by depositing the appropriate Sr$_2$RESbO$_6$ compound as a film by pulsed laser ablation on a (001) oriented YBCO on (100) oriented MgO substrate, see TABLE III, above. Films with dielectric constants lower than those obtained from bulk measurements may be due to low density in the film, higher octahedral site ordering and/or measurement used (i.e. the large difference may arise from the large difference in frequencies 1 MHz versus 10$^6$ Hz).

The compounds of the system Sr$_2$RESbO$_6$ are psuedo-cubic with departure from cubicity of 0.1% or less with Sr$_2$LuSbO$_6$ and Sr$_2$LaSbO$_6$ that are cubic. The dielectric constants are much lower than LaAlO$_3$ (22-25) and generally range from 5-16, however, even lower dielectric constants of 4.1-4.6 are reported for several thin films listed in TABLE I, and the much lower dielectric constant achieved herein is an important factor contributing toward the usefulness of the compounds disclosed herein in numerous structures and devices such as dielectric substrates, buffer layers, antennas, thin films and so on.

In the foregoing disclosure, by the term "high critical temperature thin film superconductor device" is meant a copper oxide superconductor having a critical temperature in excess of 30 K. Examples of such superconductors are: REBa$_2$Cu$_3$O$_{7-\delta}$, REBa$_2$Cu$_4$O$_8$ where RE is a rare earth element and $0 \leq \delta \leq 1$, Tl$_2$Ca$_2$Ba$_2$Cu$_3$O$_{10}$, Tl$_1$Ca$_2$Ba$_2$Cu$_3$O$_9$ and Tl$_2$Ba$_2$Ca$_1$Cu$_2$O$_8$ as well as Hg-based superconductors.

A single layer device refers to a device including a single layer of high critical temperature superconducting ferroelectric, pyroelectric, piezoelectric, or ferromagnetic material. A multi-layer device refers to a device including at least two layers of a high critical temperature superconductor, ferroelectric, pyroelectric, piezoelectric, dielectric or ferromagnetic materials.

High critical temperature superconducting, dielectric, ferroelectric, pyroelectric, piezoelectric, and ferromagnetic materials and the compounds of this invention can be used in numerous devices including flux flow transistors, current limiters, broadband impedance transformers, diodes, delay lines, resonators, antenna, antenna feeds, switches, phase shifters, mixers, amplifiers, balomoters and magneto-resistors.

The compounds of the invention can be made in the form of a bulk single crystal substrate, a dense polycrystalline disc, a crystalline expitaxial thin film or a polycrystalline thin film. In their manufacture, some form of laser ablation is preferred, but the compounds can also be made by sputtering, MOCVD, MBE, evaporation, etc.

In addition to numerous device uses already disclosed throughout this specification, the following examples illustrate two specific uses of the Sr$_2$RESbO$_6$ compounds of this invention.

An antenna can be made according to the invention by depositing a single layer of high critical temperature superconductor (HTSC) directly onto a single crystal Sr$_2$LuSbO$_6$ substrate or a substrate of other composition buffered with a layer of Sr$_2$LuSbO$_6$. The HTSC is then patterned to complete the device.

A superconductor insulator superconductor step edge Josephson junction, a multilayer superconducting device, is fabricated according to the invention using Sr$_2$YbSbO$_6$. More particularly, the device is made by depositing a single layer of HTSC on a single crystal Sr$_2$YbSbO$_6$ substrate or a substrate of other composition buffered with a layer of Sr$_2$YbSbO$_6$. Next, the HTSC is patterned by ion milling at a 45° angle. A layer of Sr$_2$YbSbO$_6$ is then deposited. Next, another HTSC layer is deposited and patterned to complete the device.

We wish it to be understood that we do not desire to be limited to the exact details of construction shown and described for obvious modifications will occur to a person skilled in the art.

What we claim is:

1. A superconductor insulator superconductor step edge Josephson junction, comprising:
   a single layer of a copper oxide superconductor deposited onto a single crystal substrate of the formula Sr$_2$YbSbO$_6$;
   said single crystal substrate being heated for at least 20 hours at between 1400° C. and 1600° C.;
   said single crystal substrate having an ordered perovskite pseudo-cubic tetragonal crystalline structure;

said single crystal substrate having a low dielectric constant between 4.1 and 16.3;

said single crystal substrate having a low dielectric loss of less than $1.0 \times 10^{-3}$ without a phase transition;

said single crystal substrate having a density GM/CC of 5.87;

said single layer of the copper oxide superconductor being patterned;

a second layer of $Sr_2YbSbO_6$ deposited onto said single layer of the copper oxide superconductor;

said formula including an $Sb^{5+}$ constituent atom with a polarizability of about 1.2 $Å^3$; and a second layer of the copper oxide superconductor deposited and patterned on said second layer of $Sr_2YbSbO_6$.

2. The superconductor insulator superconductor step edge Josephson junction, as recited in claim 1, further comprising said single layer of the copper oxide superconductor being patterned by ion milling.

3. The superconductor insulator superconductor step edge Josephson junction, as recited in claim 2, further comprising said single layer of the copper oxide superconductor being patterned by ion milling at a 45° angle.

4. A superconductor insulator superconductor step edge Josephson junction, comprising:

a single layer of a copper oxide superconductor deposited onto a substrate;

said substrate having a buffer layer with the formula $Sr_2YbSbO_6$;

said buffer layer being heated for at least 20 hours at between 1400° C. and 1600° C.;

said buffer layer having an ordered perovskite pseudo-cubic tetragonal crystalline structure;

said buffer layer having a low dielectric constant between 4.1 and 16.3;

said buffer layer having a low dielectric loss of less than $1.0 \times 10^{-3}$ without a phase transition;

said buffer layer having a density GM/CC of 5.87;

said single layer of the copper oxide superconductor being patterned;

a second layer of $Sr_2YbSbO_6$ deposited onto said single layer of the copper oxide superconductor;

said formula including an $Sb^{5+}$ constituent atom with a polarizability of about 1.2 $Å^3$; and a second layer of the copper oxide superconductor deposited and patterned on said second layer of $Sr_2YbSbO_6$.

5. The superconductor insulator superconductor step edge Josephson junction, as recited in claim 4, further comprising said single layer of the copper oxide superconductor being patterned by ion milling.

6. The superconductor insulator superconductor step edge Josephson junction, as recited in claim 5, further comprising said single layer of the copper oxide superconductor being patterned by ion milling at a 45° angle.

\* \* \* \* \*